United States Patent [19]
Kim

[11] Patent Number: 5,071,790
[45] Date of Patent: Dec. 10, 1991

[54] SEMICONDUCTOR DEVICE AND ITS MANUFACTURING METHOD

[75] Inventor: Eutsong Kim, Anyang, Rep. of Korea

[73] Assignee: Samsung Electronics Co., Ltd., Suwon, Rep. of Korea

[21] Appl. No.: 411,705

[22] Filed: Sep. 25, 1989

[30] Foreign Application Priority Data

Sep. 30, 1988 [KR] Rep. of Korea .................. 12889

[51] Int. Cl.$^5$ .................................................. H01L 21/44
[52] U.S. Cl. ........................................ 437/195; 437/52; 437/241; 357/23.6
[58] Field of Search .................... 437/52, 195, 231; 357/23.6

[56] References Cited

U.S. PATENT DOCUMENTS 4,342,617  8/1982  Fu et al. ................... 437/228

FOREIGN PATENT DOCUMENTS 0170550 10/1982 Japan ........................... 437/231
0261730 10/1988 Japan ........................... 437/231

Primary Examiner—Olik Chaudhuri
Assistant Examiner—Long Pham
Attorney, Agent, or Firm—Blakely, Sokoloff, Taylor & Zafman

[57] ABSTRACT

In A semiconductor device for forming a bit line and a metal electrode on a semiconductor substrate in the semiconductor device making use of an insulating film between said bit line andd said metal electrode, the semiconductor device is characterized in that the semiconductor device comprises a plasma oxynitride film with the same etch rate as said insulation film between said bit line said insulation film.

7 Claims, 2 Drawing Sheets

SEMICONDUCTOR DEVICE AND ITS MANUFACTURING METHOD

BACKGROUND OF THE INVENTION

The present invention relates to a semiconductor device and its manufacturing method using a planarization process, particularly making use of the heat treatment of silicide used as a bit line and the reflow of a doped glass.

FIG. 1 is an example of such a semiconductor device manufactured by a conventional process. Particularly, it is a sectional diagram of memory cell part in a semiconductor device.

FIG. 2 is an example of the contact area of a semiconductor device manufactured by a conventional process.

In this drawings, 1 indicates the silicon substrate, 2 the contact layer, 3 the polysilicon gate electrode, 4 the gate oxide film, 5 the doped glass, 6 the silicide bit line, 8 the doped glass, 9 the metal electrode, 10 the low temperature oxide film.

As shown in the drawings, the planarization process is made between the bit line and the metal electrode using only a doped glass, and then the thickness of a doped glass between the bit line and the metal electrode is thinning, and as a consequence, leakage currents are growing.

Also, to decrease the growth of leakage currents between the bit line and the doped glass, the low temperature oxide film is added. This results in a break in the metal electrode in the contact area owing to the difference of the etch rate between the doped glass and the low temperature oxide film.

Therefore, the fact that leakage currents between the bit line and the metal electrode are larger, the breakdown voltage is declines or often shorted is unavoidable. And the problems in the production yield ratio and reliability are also appear.

SUMMARY OF THE INVENTION

Accordingly, an object of the invention is to provide a semiconductor device and its manufacturing method for solving the above problems.

For achieving the above object, a plasma oxynitride film having the same etch rate as that of a doped glass is established by the chemical vapour deposition(CVD).

As a consequence, the characteristics of leakage currents and break-down voltages between the bit line and the metal electrode are improved.

Also, because the etch rate is the same as that of a doped glass, the etching profile in the contact area is made without breaking the metal electrode.

BRIEF DESCRIPTION OF THE DRAWINGS

The invention will be readily understood from the following more detailed description presented in conjunction with the following drawings, in which.

DETAILED DESCRIPTION OF THE PREFERRED EMBODIMENT

Figure 1:
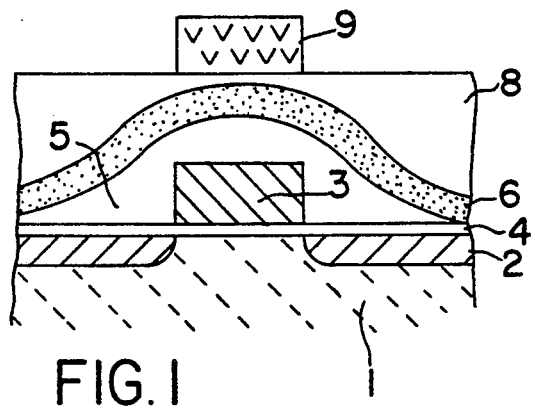
FIG. 1 is a sectional diagram showing a semiconductor device manufactured by a conventional process.
Figure 2:
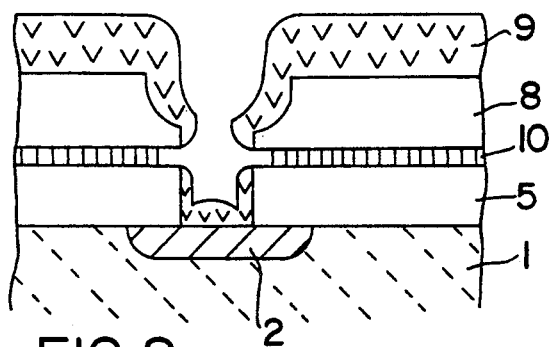
FIG. 2 is a sectional diagram showing the contact area of a semiconductor manufactured by a conventional process.

FIG. 1 and FIG. 2 are samples for explaining a semiconductor manufactured by a conventional process.

Figure 3:
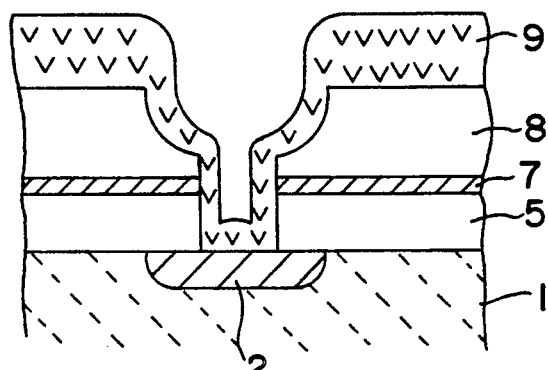
FIG. 3 is a sectional diagram showing the contact area of a semiconductor improved by the invention.

FIG. 3 is a sectional view of the contact area in a semiconductor device manufactured by the present invention.

As shown in FIG. 1, the semiconductor up to the gate electrode 3 is formed by a known process, and then the glass film 5 doped with phosphorus(P) or boron(B) is deposited, and then the heat treatment is carried out at a temperature of 800°–900° C., and as a consequence, the difference of steps is reduced.

After that, the silicide film 6 of tungsten or molybdenum is deposited by chemical vapour deposition (CVD) or by sputtering.

After that, the glass doped with the low temperature oxide film or phosphorus(P) or boron(B) is covered with surface thickness of 1000–3000 Å, and then heat treatment is carried out at a temperature of 800°–900° C.

As a consequence, resistivity of the tungsten silicide film 6 is reduced.

In summary, the glass 8 doped with phosphorus(P) or boron(B) is formed by the chemical vapour deposition (CVD), and then heat treatment is carried out at a temperature of 800°–900° C., and as a consequence, the planarization process is made.

The metal electrode 9 is formed, and at this time, where the step difference of the tungsten silicide film 6 used as the bit line is higher, the characteristics of breakdown voltage and leakage currents become worse as the thickness of the doped glass used as an oxide film is thinning.

To solve the above problems, a low temperature oxide film 10 in place of the doped glass 8 as a capping film of the tungsten silicide may be used. Because of the difference of the etch rate between the oxide film 10 and the doped glass 8, the metal electrode 9 may break at the contact area, as shown in FIG. 2, and then bad conditions show up.

Therefore, in the present invention, as shown in FIG. 3 the plasma oxynitride film 7, which has the same etch rate (900~1100 Å/min) as that of the doped glass 8 with phosphorus(P) or boron(B) and also has no flowing characteristics like the doped glass 8 in the heat treatment range of 800°–900° C., is used as a capping film of the tungsten silicide film.

Consequently, because the plasma oxynitiride film 7 has better characteristics of breakdown voltage and leakage currents than that of the doped glass, it is possible to prevent a short between the tungsten silicide used as a bit line and the metal electrode, or to prevent falling-out in breakdown voltage characteristics.

Also, as the plasma oxynitride film 7 has the same etch rate as that of the doped glass, the metal electrode 9 is not broken like in FIG. 2 and it is capable of keeping the stationary characteristics like FIG. 3.

FIG. 4 is a diagram showing a manufacturing process to which the present invention is applied.

Figure 4A:
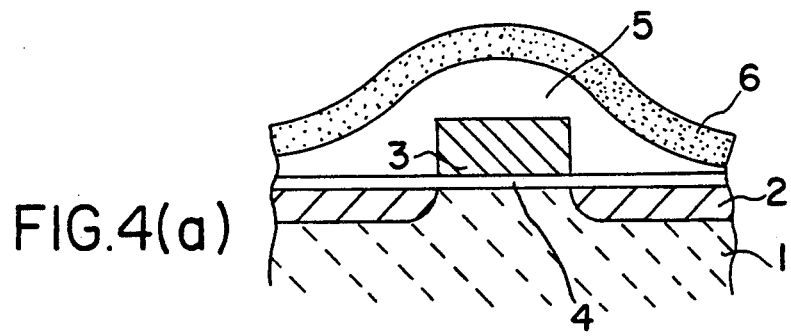
FIG. 4A through FIG. 4D are diagrams showing the manufacturing process flow which explains diagramatically the manufacturing process sequence in a semiconductor device improved by the invention.

Starting at FIG. 4(a), the process up to the poly silicon gate component 3 is the same as conventional manufacturing process.

After that, the glass film 5 doped with phosphorus(P) and boron(B) of 4.5 wt % and 3.2 wt %, respectively has to be formed to a thickness of 3500 Å by chemical vapour deposition (CVD).

After that, heat treatment is carried out at a temperature of 900° C. for 60 min in $N_2$ ambient, and then the difference of steps can be reduced.

After that, the tungsten silicide component 6 has to be formed as the thickness of 2500 Å using the chemical vapour deposition(CVD).

Figure 4B:
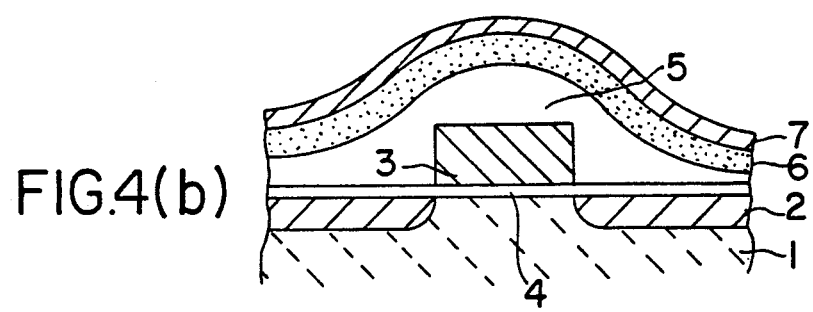

And as shown in FIG. 4(b), the plasma oxynitride film 7 has to be formed as the thickness of 1800 Å using chemical vapour deposition (CVD).

At this time, regarding the gas, $N_2$ is 1450 SCCM, $SiH_4$ 150 SCCM, ammonia 1120 SCCM, $N_2O$ 280 SCCM, the pressure 400 mTorr, the temperature 320° C., and the power 500 W.

Also, at this time, in the plasma oxynitride of 7:1 B.O.E. the etch rate is 800 Å/min.

After that, in the furnace system, as the heat treatment is carried out at a temperature of 850° C. for 30 min in $N_2$ ambient, the resistivity of the tungsten silicide film 6 is falling-off.

Figure 4C:
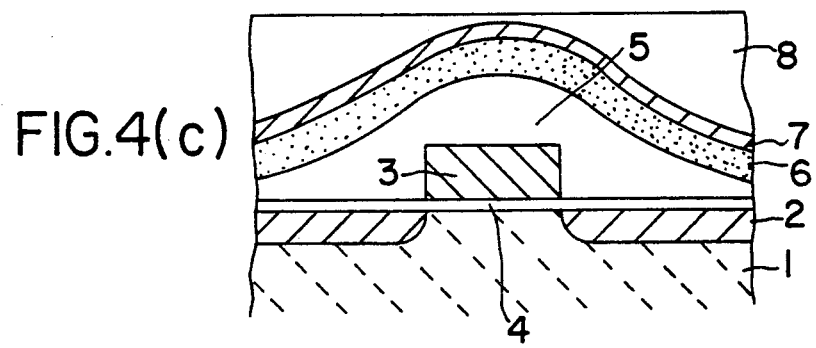

And then, as shown in FIG. 4(c), glass component 8/doped with phosphorus(P) and boron(B) of 4.5 wt % and 3.2 wt %, respectively, is formed to a thickness at 6000 Å using chemical vapour deposition(CVD).

After that, the heat treatment is carried out at a temperature of 875° C. for 60 min in $N_2$ ambient using the furnace system, as shown in FIG. 4(c).

Figure 4D:
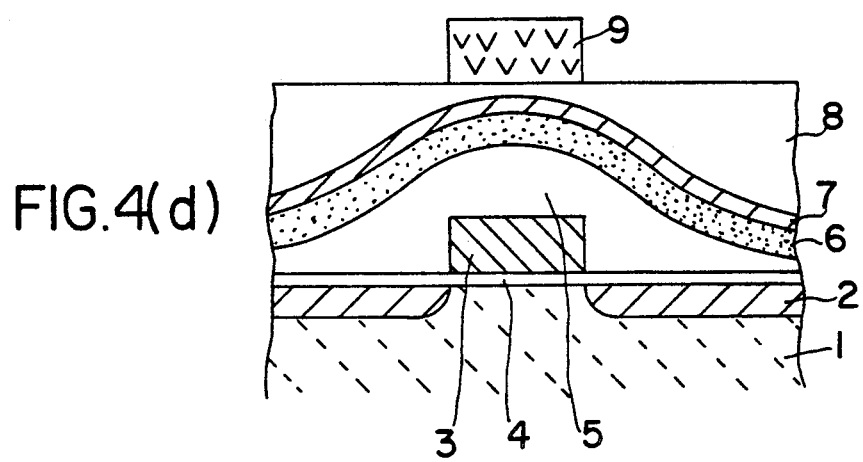

After that, as shown in FIG. 4(d) the contact etching is made in contact area, and then, after the heat treatment, the etch rate is reduced from 1100 Å/min to 800 Å/min, which is the same as that of the plasma oxynitride film.

Therefore, in the contact etcing, bad conditions like FIG. 2 does not occur and it is possible to obtain a good etching profile.

After that, when the metal electrode 9 is formed, the manufacturing process is completely accomplished.

In the preferred embodiment, as the capping film of the silicide bit line 6, a plasma oxynitride film 7 is formed thereon, which prevents short between the bit line and the metal electrode, and prevents falling-off of breakdown voltage, and prevents the growth of leakage currents.

Therefore, the manufacturing process tolerance in the planarization process is increased largely; as a consequence, the production yield ratio is larger and the reliability is improved.

The present invention can be applied for a semiconductor device manufacture using the planarization process which makes use of the reflow of doped glass.

What is claimed as:

1. A method of manufacturing a semiconductor device starting from a substrate into which is formed a contact layer, and wherein a gate oxide film is formed on the substrate, a polysilicon gate is formed on the gate oxide film, a first doped glass layer is formed covering the gate oxide film and polysilicon gate electrode, the method comprising the steps of:

forming a bit line layer on the first doped glass layer by chemical vapor deposition;

forming a plasma oxynitride film on the bit line layer by plasma enhanced chemical vapor deposition;

forming a second doped glass layer on the plasma oxynitride film by chemical vapor deposition; and forming a metal electrode on the second doped glass layer.

2. A method of manufacturing a semiconductor device according to claim 1, wherein the first doped glass layer is doped with phosphorous of 4.5 wt % and boron of 3.2 wt % and has a thickness of about 3500 Å, and wherein heat treatment is carried out thereafter at a temperature of 900 degrees C. for 60 minutes inside an $N_2$ ambient atmosphere furnace system.

3. A method of manufacturing a semiconductor device according to claim 2, wherein the bit line layer is formed to a thickness of about 2500 Å.

4. A method of manufacturing a semiconductor device according to claim 3, wherein the plasma oxynitride film is formed to a thickness of about 1800 Å, and wherein heat treatment is carried out thereafter at a temperature of 850 degrees C. for 30 minutes inside an $N_2$ ambient atmosphere furnace system.

5. A method of manufacturing a semiconductor device according to claim 4, wherein the second doped glass layer is doped with phosphorous of 4.5 wt % and boron of 3.2 wt % and has a thickness of about 6000 Å, and wherein heat treatment is carried out thereafter at a temperature of 875 degrees C. for 60 minutes inside an $N_2$ ambient atmosphere furnace system.

6. A method of manufacturing a semiconductor device according to claim 2, wherein the plasma oxynitride film has an etch rate substantially the same as the second doped glass layer.

7. A method of manufacturing a semiconductor device according to claim 6, wherein the etch rate ranges from 900 to 1100 Å/min.

* * * * *

UNITED STATES PATENT AND TRADEMARK OFFICE
CERTIFICATE OF CORRECTION

PATENT NO. : 5,071,790
DATED : 12/10/91
INVENTOR(S) : Kim

It is certified that error appears in the above-identified patent and that said Letters Patent is hereby corrected as shown below:

ON TITLE PAGE:

[54] Title    delete "SEMICONDUCTOR DEVICE AND ITS MANUFACTURING METHOD"

insert -- PROCESS FOR FORMING AN INTERLAYER DIELECTRIC FILM BETWEEN A BIT LINE AND A METAL ELECTRODE ON A SEMICONDUCTOR DEVICE -- col. 02, line 57    delete "out"    insert --off--

Signed and Sealed this

Twenty-sixth Day of May, 1992

*Attest:*

DOUGLAS B. COMER

*Attesting Officer*    *Acting Commissioner of Patents and Trademarks*